United States Patent
Du et al.

(10) Patent No.: US 10,042,006 B2
(45) Date of Patent: Aug. 7, 2018

(54) BATTERY STATE OF HEALTH ESTIMATION USING CHARGING RESISTANCE EQUIVALENT

(71) Applicant: GM Global Technology Operations LLC, Detroit, MI (US)

(72) Inventors: Xinyu Du, Oakland Township, MI (US); Yilu Zhang, Northville, MI (US); Mark J. Rychlinski, Farmington Hills, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 879 days.

(21) Appl. No.: 14/301,944

(22) Filed: Jun. 11, 2014

(65) Prior Publication Data

US 2015/0362561 A1 Dec. 17, 2015

(51) Int. Cl.
*G01R 31/36* (2006.01)

(52) U.S. Cl.
CPC ..... *G01R 31/3679* (2013.01); *G01R 31/3624* (2013.01)

(58) Field of Classification Search
CPC ............. G01R 31/3606; Y02T 10/7005; Y02T 10/7044; B60L 11/1861; B60L 2240/549; B60L 2240/547; H01M 10/48
USPC .............................................. 702/63; 701/22
See application file for complete search history.

(56) References Cited

U.S. PATENT DOCUMENTS

| | | | |
|---|---|---|---|
| 6,616,819 B1 * | 9/2003 | Liamos | G01N 27/3272 204/403.02 |
| 6,737,831 B2 * | 5/2004 | Champlin | G01R 31/3651 320/130 |
| 7,078,878 B2 * | 7/2006 | Koo | G01R 31/3631 320/132 |
| 7,983,862 B2 * | 7/2011 | Zhang | H01M 10/4207 702/63 |
| 8,111,037 B2 | 2/2012 | Zhang et al. | |
| 8,159,189 B2 | 4/2012 | Zhang | |
| 8,315,829 B2 | 11/2012 | Zhang | |
| 2001/0004029 A1 * | 6/2001 | Wakashiro | B60K 6/485 180/170 |
| 2002/0109504 A1 * | 8/2002 | Champlin | G01R 31/3651 324/426 |
| 2002/0120906 A1 * | 8/2002 | Xia | G01R 31/3651 716/111 |
| 2005/0030041 A1 * | 2/2005 | Koo | G01R 31/3631 324/433 |
| 2012/0072146 A1 * | 3/2012 | Hsu | G01R 31/3651 702/63 |
| 2012/0105069 A1 * | 5/2012 | Wang | G01R 31/3679 324/427 |
| 2012/0136595 A1 * | 5/2012 | Tang | H01M 10/425 702/63 |
| 2012/0306450 A1 * | 12/2012 | Nakayama | G06F 1/263 320/134 |
| 2013/0041552 A1 * | 2/2013 | MacNeille | G01C 21/3469 701/32.9 |

(Continued)

OTHER PUBLICATIONS

J. Schiffer et al. ; Journal of Power Sources 168(2007) 66-78.

*Primary Examiner* — Roy Y Yi
*Assistant Examiner* — Jeffrey Aiello
(74) *Attorney, Agent, or Firm* — BrooksGroup

(57) ABSTRACT

A number of illustrative variations may include a method of estimating battery health including using a charging resistance equivalent.

6 Claims, 4 Drawing Sheets

(56) References Cited

U.S. PATENT DOCUMENTS

| | | | |
|---|---|---|---|
| 2013/0185008 A1* | 7/2013 | Itabashi | G01R 31/3651 702/63 |
| 2013/0234648 A1* | 9/2013 | Kelty | B60L 1/02 320/106 |
| 2015/0024279 A1* | 1/2015 | Tan | H01M 10/0565 429/303 |
| 2015/0066406 A1* | 3/2015 | Sun | G01R 31/3679 702/63 |
| 2016/0131714 A1* | 5/2016 | Kuusisto | B60L 11/1861 702/63 |

* cited by examiner

BATTERY STATE OF HEALTH ESTIMATION USING CHARGING RESISTANCE EQUIVALENT

TECHNICAL FIELD

The field to which the disclosure generally relates to includes battery health estimation.

BACKGROUND

Numerous methods of battery health estimation exist.

SUMMARY OF ILLUSTRATIVE VARIATIONS

A number of illustrative variations may include a method of estimating battery health including using a charging resistance equivalent.

Other illustrative variations within the scope of the invention will become apparent from the detailed description provided hereinafter. It should be understood that the detailed description and specific examples, while disclosing variations of the invention, are intended for purposes of illustration only and are not intended to limit the scope of the invention.

BRIEF DESCRIPTION OF THE DRAWINGS

Select examples of variations within the scope of the invention will become more fully understood from the detailed description and the accompanying drawings, wherein.

DETAILED DESCRIPTION OF ILLUSTRATIVE VARIATIONS

The following description of the variations is merely illustrative in nature and is in no way intended to limit the scope of the invention, its application, or uses.

Figure 4:
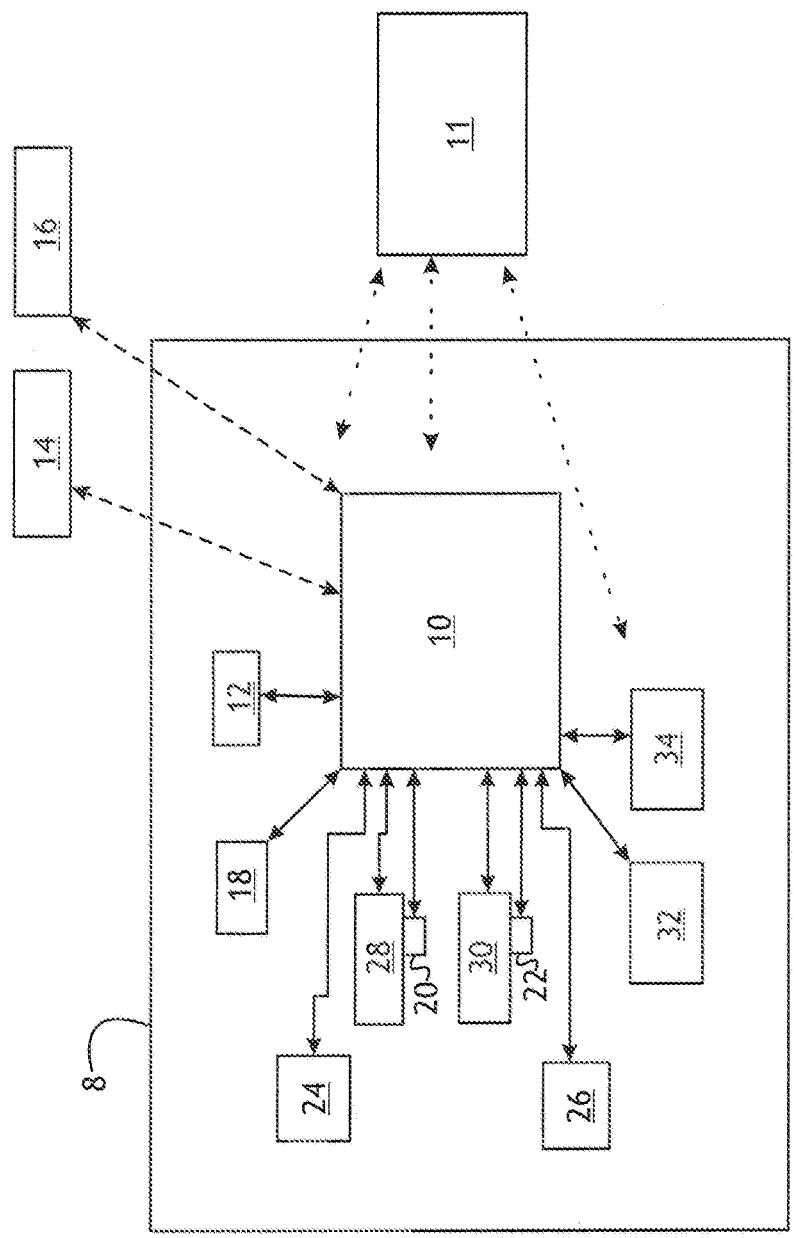
FIG. 4 is a schematic illustration of a vehicle including a controller construct and arranged to estimate the health of a battery using resistance estimation.

Referring to FIG. 4, in a number of illustrative variations, a vehicle 8 may include a controller 10, which is capable of processing at least one of sequential logic or combinational logic, may be provided. Additionally, a device capable of reading data from memory and/or external storage devices 12 may be in electrical communication with components including but not limited to the controller. The controller may have onboard memory and may be in electrical communication with an external data storage device 14 as well as external memory devices 16. Any data which components might access may be stored in memory, on a hard disk 18, or in any storage means which is known in the art and may be accessible to the controller. The controller may also be in electrical communication with any number of sensors 20, 22, controllers 24, 26, batteries 28, 20, renewable energy sources 32 or other electrical devices 34 and may have the ability to store and timestamp data indicative of readings and/or signals from any number of sensors. Any of the above stated components may be operatively connected together receive and send signals, commands and/or energy and/or provide input or contribute to the function and/or operation of the other above stated components or to other components in the vehicle. Furthermore, one or more of the aboved stated components may be operatively connected by telematics to a data center 11 outside of the vehicle constructed and arranged to receive and send signals and commands to carry out the above stated functions and operations of one or more of the components, and constructed and arranged to perform the algorithms and methods described herein.

In a number of illustrative variations, stored and/or actively observed battery data may be used to determine the state of health of the battery. Data used for this determination may include but is not limited to any of a battery charging resistance equivalent, a battery terminal voltage, a battery current, an open circuit voltage, or a battery state of charge.

In a number of illustrative variations, a charging current threshold is determined based on available data regarding the battery type or rating as well as a battery operation data. The threshold current may be used in filtering battery current values which are lower than the threshold current from being used in calculating a charging resistance equivalent—the use of low battery current values in calculating the charging resistance may lead to an inaccurate calculation of the charging resistance equivalent. The controller may filter the input data by excluding any vehicle battery current input data, and associated vehicle battery terminal voltage input data which falls below a predetermined current threshold value in further operations. Such exclusion may be performed by simply flagging the data which is desired to be excluded, actually removing the undesirable data from its data structure, or by any method which is known in the art.

Figure 1:
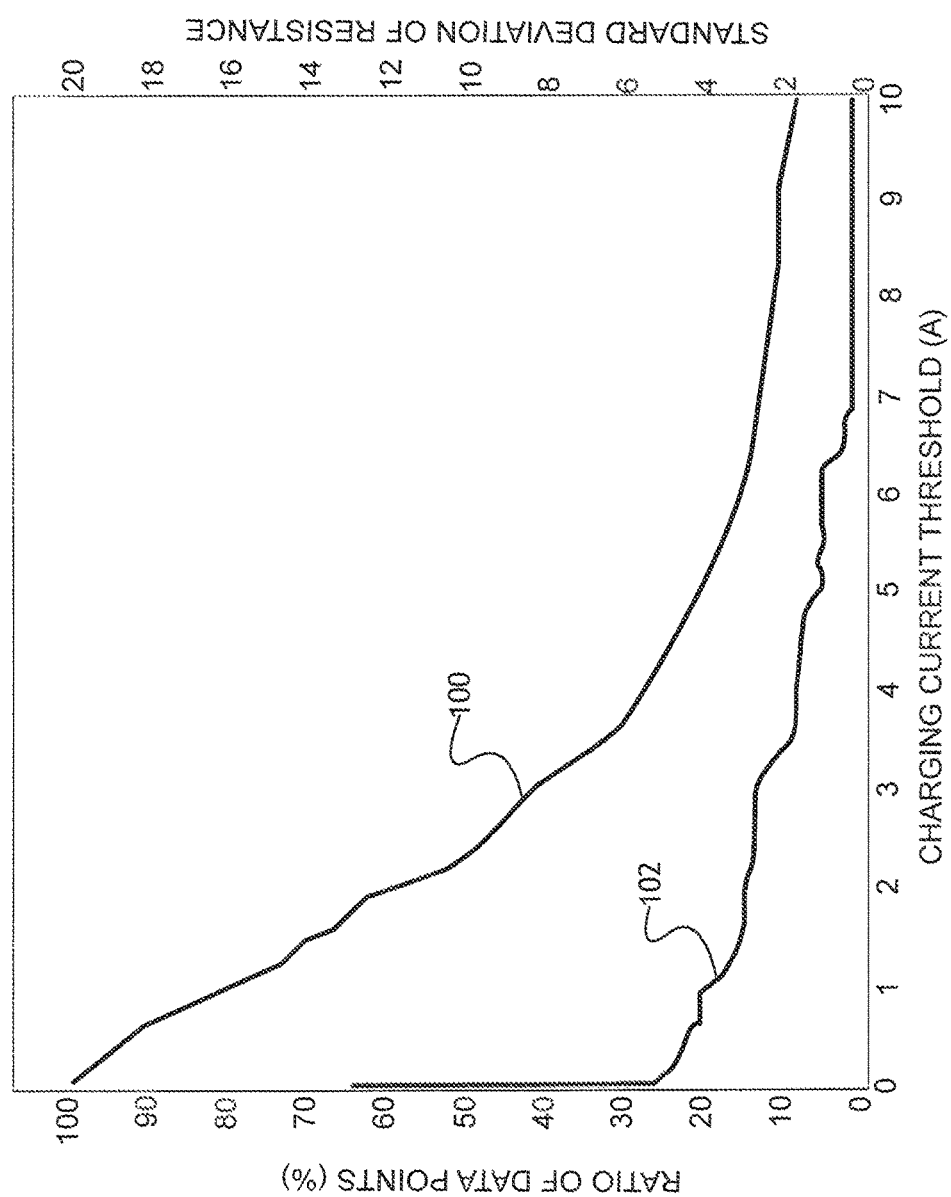
FIG. 1 illustrates a graphical representation of a current threshold choice and associated values.

In a number of illustrative variations, and as shown in FIG. 1, if the charging current threshold is to be chosen manually, a range of reasonable charging current thresholds may be plotted as an X-axis; a ratio of a number of healthy batteries having charging resistance equivalents falling above each value within a number of values within the range of charging current threshold values to a number of healthy batteries charging resistance equivalents falling below each value within the number of values within the range of charging current values may be plotted over the range of charging current thresholds, as a Y-axis; and a standard deviation of charging resistance equivalents $\rho_c$ amongst the batteries having a charging current less than each value within a number of values within the range of charging current threshold values may be plotted over the range of charging current thresholds, as a Y-axis. The ratio of a number of healthy batteries having charging resistance equivalents falling above each value within a number of values within the range of charging current threshold values to a number of healthy batteries charging resistance equivalents falling below each value within the number of values within the range of charging current values is plotted over the range of charging current thresholds as line 100. The standard deviation of charging resistance equivalents $\rho_c$ amongst the batteries having a charging current less than each value within a number of values within the range of charging current threshold values is plotted over the range of charging current thresholds as line 102.

In a number of illustrative variations, a controller which is capable of processing mathematics and at least one of sequential logic or combinational logic, may be in electrical communication a device which utilizes a battery. After an amount of time after the device has entered a ready state, input data including but not limited to any of a battery terminal voltage, a battery current, an open circuit voltage, or a battery state of charge may be collected, observed, received or determined by the controller. The input data may be validated and/or organized by the controller and conditional or sequential logic may be executed against the input data to move any sequence of any program which the controller may execute forward. The controller may then make any determinations necessary for the estimation of the battery's state of health.

Figure 2:
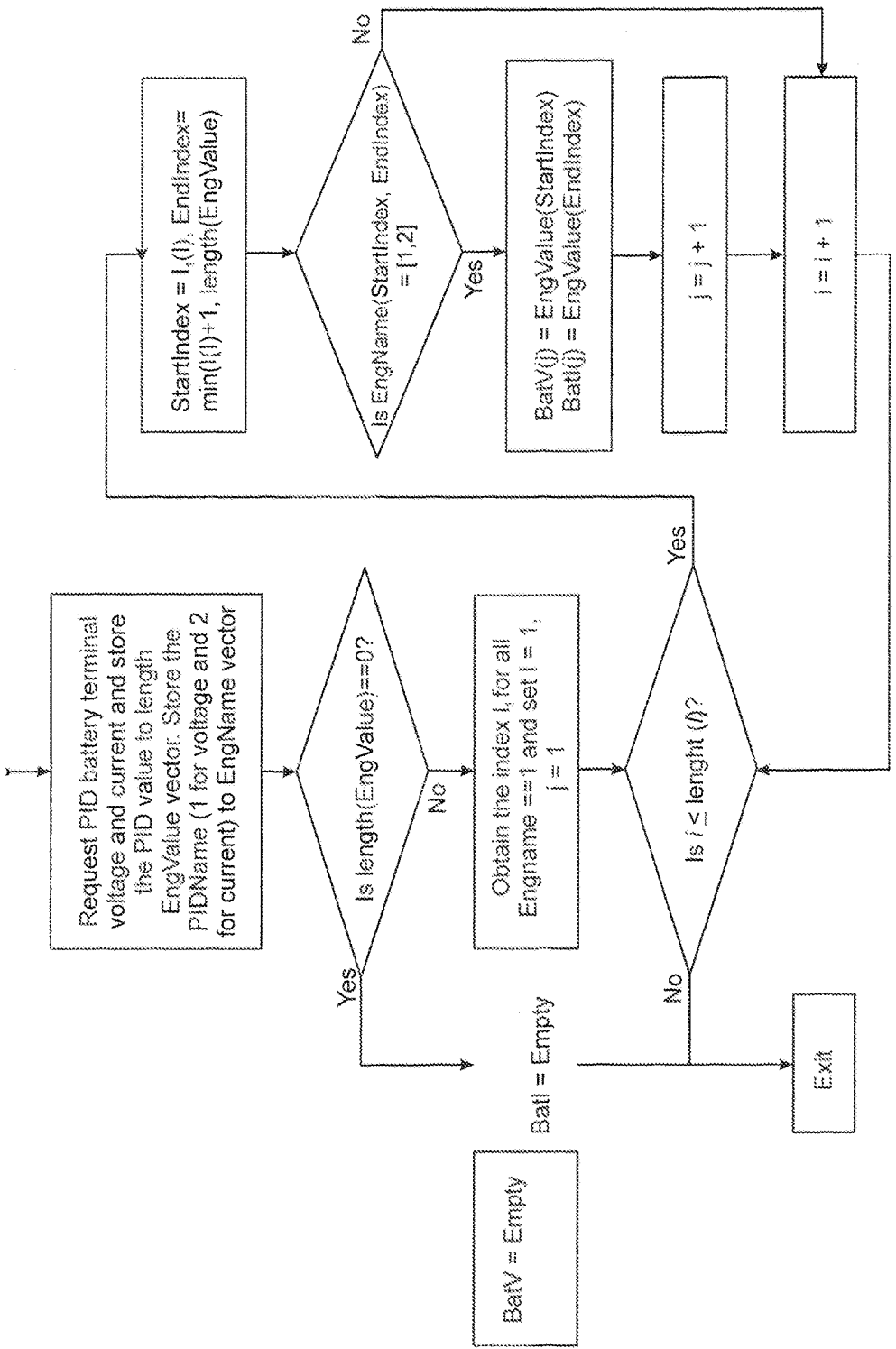
FIG. 2 illustrates a graphical representation of battery voltage current matching and alignment as performed with generic data structures by a controller according to a number of non-limiting variations.

In a number of illustrative variations, and as illustrated by FIG. 2, a controller which is capable of processing mathematics and at least one of sequential logic or combinational logic may obtain input data and organize and filter the data. The input data obtained may include but is not limited to a number of relatable battery voltage values and battery current values. The controller may place the battery voltage values and battery current values data in a data structure EngValue which may be iterated through. The controller may store indicators of the type of each piece of input data which is stored in EngValue by placing flags to be associated with each piece of data in EngValue in a data structure EngName at a corresponding index. Specifically, in FIG. 2, the flags placed in EngName are '1' to indicate that the value at the corresponding index in EngValue is a voltage value, and '2' to indicate that the value at corresponding index in EngValue is a current value. After the controller has determined that EngValue contains voltage values, the controller may then iterate through EngName searching for a '1' flag followed by a '2' flag at neighboring indices. If the controller finds such a pair, the value in EngValue at the corresponding index to '1' in EngName is noted as a voltage value with an associated current value by placing the value in a data structure of valid battery voltage values BatV. Similarly, the value in EngValue at the corresponding index to '2' in EngName is noted as a current value with an associated voltage value by placing the value in a data structure of valid battery current values BatI at an index corresponding to that of the valid battery voltage value placed in BatV. The controller may then proceed with further operations which utilize battery voltage values and battery current values, utilizing such values only from the data structures BatV and BatI, respectively, thereby excluding battery voltage values and battery current values which were found to not be part of a voltage/current pair.

Figure 3:
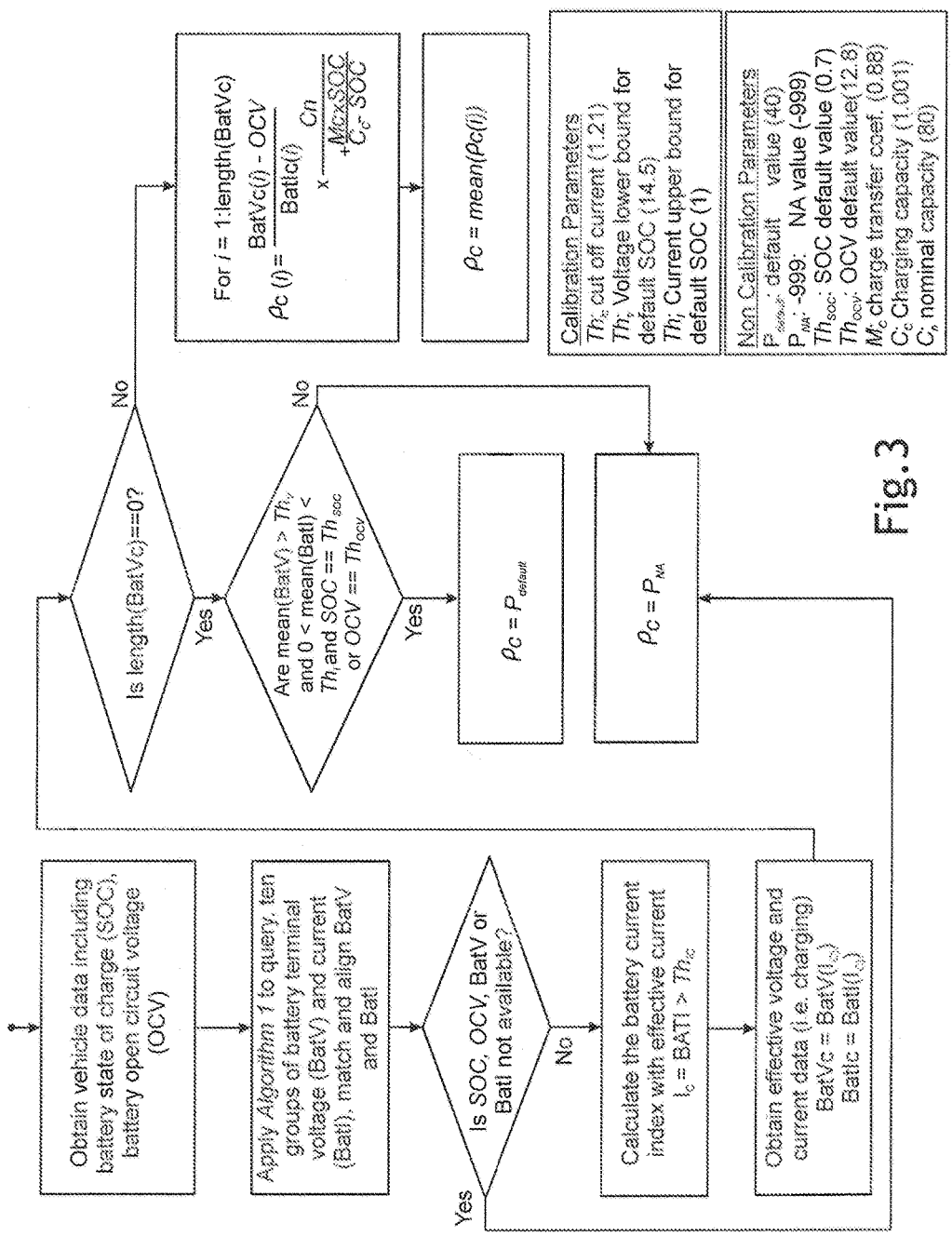
FIG. 3 illustrates a graphical representation of a logical flow which may be used to determine what value to use as the charging resistance equivalent according to a number of non-limiting variations.

In a number of illustrative variations, and as illustrated by FIG. 3, a controller which is capable of processing mathematics and at least one of sequential logic or combinational logic, may be housed onboard a vehicle having a vehicle battery. After several units of time after the vehicle engine's ignition, input data including ten groups of vehicle battery terminal voltage and vehicle battery current, an open circuit voltage and a vehicle battery state of charge may be collected, observed, received or determined by the controller and placed in data structures which may be iterated through. The controller may then begin of organizing the battery terminal voltage and battery current readings by first determining that all the input data is available to the controller, and then making sure that each vehicle battery terminal voltage and vehicle battery current are correctly organized within their respective data structures such that the two values might be correctly associated with each other as their respective data structures are iterated through. Such organization may entail excluding values which are found to be without an associated partner value (for example: a current value without an associated voltage value). At this time, or at any other time, the controller may obtain effective input data by filtering out any vehicle battery current input data, and associated vehicle battery terminal voltage input data, which falls below a predetermined current threshold value. The controller may then use the effective input data to determine which value should be used as a charging resistance equivalent in further calculations.

In a number of illustrative variations, determining which value should be used as a charging resistance equivalent in further calculations comprises first determining whether all of the desired input data is available, and if the desired input data is available, filtering the input data and determining whether any effective input data is left. If there is no effective input data after filtering, the controller may then determine whether the mean of all of the organized, available battery terminal voltage data is less than a predetermined lower bound voltage, whether the mean of all of the organized, available battery current data is greater than zero and less than a predetermined upper bound current, and whether the battery's state of charge is equal to a predetermined default state of charge value or whether the open circuit voltage is equal to a predetermined default open circuit voltage value. If this condition is met, the controller may use a first default value as a charging resistance equivalent in further calculations. If this condition is not met, the controller may use a second default value as a charging resistance equivalent in further calculations.

In a number of illustrative variations, determining which value should be used as a charging resistance equivalent in further calculations comprises first determining whether all of the desired input data is available, and if not, using a second default value as a charging resistance equivalent in further calculations.

In a number of illustrative variations, if the controller determines that all of the desired input data is available, and that filtering results in a number of effective battery terminal voltage and associated battery current values, the controller may use determine the value for the charging resistance equivalent $\rho_c$ as follows:

$$p_c(i) = \frac{BatVc(i) - OCV}{BatIc(i)} \times \frac{Cn}{1 + \frac{Mc \times SOC}{Cc - SOC}}$$

$$\rho_c = \sum_{i=1}^{i=length(BatVc)} \frac{p_c(i)}{length\ (BatVc)}$$

Where $M_C$ is a charge transfer coefficient of the battery, $C_C$ is a normalized charging capacity of the battery, and $C_n$ is a nominal capacity of the battery.

The following description of variants is only illustrative of components, elements, acts, product and methods considered to be within the scope of the invention and are not in any way intended to limit such scope by what is specifically disclosed or not expressly set forth. The components, elements, acts, product and methods as described herein may be combined and rearranged other than as expressly described herein and still are considered to be within the scope of the invention.

Variation 1 may include a method of estimating the state of health of a battery comprising: calculating a number of charging equivalents for a number of healthy batteries of a particular type and rating; determining a charging current threshold value $Th_{Ic}$, a lower bound voltage $Th_V$, and an upper bound current $Th_i$ from the calculated charging equivalents; collecting readings including but not limited to a state of charge (SOC) reading, an open circuit voltage (OCV) reading, and ten groups of terminal voltage readings and associated current readings from a vehicle battery after ignition-on; identifying values that are terminal voltage readings and placing them in a data structure V which can be iterated through; identifying values that are current readings and placing them in a data structure I which can be iterated through; identifying all of the current readings (BatIc) and associated terminal voltage readings (BatVc) which are less than $Th_{Ic}$; using at least some of the ten groups of terminal voltage and associated current readings and OCV to determine the value of the charging resistance equivalent $\rho_c$; and using a controller to estimate the health of the battery using $\rho_c$.

Variation 2 may include the method of variation 1 wherein determining a charging current threshold value $Th_{Ic}$, a lower bound voltage $Th_V$, and an upper bound current $Th_i$ from the calculated charging resistance equivalents comprises: providing a number of charging current threshold values within a range of charging current threshold values; determining a ratio of a number of healthy batteries having charging resistance equivalents falling above each value within a number of values within the range of charging current threshold values to a number of healthy batteries charging resistance equivalents falling below each value within the number of values within the range of charging current values; determining a standard deviation of a charging resistance equivalent $\rho_c$ amongst the batteries having a charging current less than each value within a number of values within the range of charging current threshold values; selecting a threshold value $Th_{Ic}$ within the number of values within the range of charging current threshold values which is associated with both a high ratio and a small standard deviation; and using the selected threshold value as a cut-off value for disabling $\rho_c$ estimation when the battery current is lower than the selected threshold.

Variation 3 may include the method of variation 2 wherein a visual indication of reasonable charging current threshold choices is formed, comprising: plotting the range of charging current threshold values as an X-axis; plotting the standard deviation over the range of charging current threshold values with a range of standard deviation values as a Y-axis; and plotting each determined ratio over the range of charging current threshold values with a ranged of ratio values as a Y-axis;

Variation 4 may include method of variation 1 wherein determining the value of the charging resistance equivalent $\rho_c$ comprises: using all of the identified current readings and associated terminal voltage readings >$Th_{Ic}$ to solve for $\rho_c$ according to:

$$\rho_c(i) = \frac{BatVc(i) - OCV}{BatIc(i)} \times \frac{Cn}{1 + \frac{Mc \times SOC}{Cc - SOC}}$$

$$\rho_c = \sum_{i=1}^{i=length(BatVc)} \frac{\rho_c(i)}{length\ (BatVc)}$$

where $M_C$ is a charge transfer coefficient of the battery, $C_C$ is a normalized charging capacity of the battery, and $C_n$ is a nominal capacity of the battery.

Variation 4 may include the method of variation 1 wherein determining the value of the charging resistance equivalent $\rho_c$ comprises: setting $\rho_c$ equal to a preset value $P_{default}$ if the mean value of BatV is less than $Th_V$ and 0 is less than the mean value of BatI when the mean value of BatI is less than $Th_I$, and SOC is equal to $Th_{SOC}$ or OCV is equal to $Th_{OCV}$.

Variation 5 may include the method of variation 1 wherein determining the value of the charging resistance equivalent $\rho_c$ comprises: setting $\rho_c$ equal to a preset value $P_{default}$ if the mean value of BatV is not less than $Th_V$ or 0 is not less than the mean value of BatI, or the mean value of BatI is not less than $Th_I$, or SOC is not equal to $Th_{SOC}$ and OCV is not equal to $Th_{OCV}$, then $\rho_c$ equals a preset value $P_{NA}$.

The above description of select variations within the scope of the invention is merely illustrative in nature and, thus, variations or variants thereof are not to be regarded as a departure from the spirit and scope of the invention.

What is claimed is:

1. A method of communicating an estimated state of health of a battery to a vehicle component comprising:
    calculating a number of charging equivalents for a number of healthy batteries of a particular type and rating;
    determining a charging current threshold value $Th_{Ic}$, a lower bound voltage $Th_V$, and an upper bound current $Th_i$ from the calculated charging equivalents;
    providing a vehicle comprising an ignition, a vehicle battery, any number of sensors, and controller programmed to calculate an estimated battery state of health of a the vehicle battery;
    turning the vehicle ignition on;
    placing the vehicle battery in a steady state;
    using the sensors to collect readings including but not limited to a state of charge (SOC) reading, an open circuit voltage (OCV) reading, and multiple groups of terminal voltage readings and associated current readings from the vehicle battery after the vehicle battery has reached a steady state;
    using the controller to identify values that are terminal voltage readings and place them in a data structure V which can be iterated through;
    using the controller to identify values that are current readings and place them in a data structure I which can be iterated through;
    using the controller to identify all of the current readings (BatIc) and associated terminal voltage readings (BatVc) which are less than $Th_{Ic}$;
    using the controller to determine the value of the charging resistance equivalent $\rho_c$ by using at least some of the multiple groups of terminal voltage and associated current readings and OCV;
    using the controller to calculate an estimated battery state of health using $\rho_c$; and
    using the controller to send a signal regarding the estimated battery state of health to another component in the vehicle.

2. The method of claim 1 wherein determining a charging current threshold value $Th_{Ic}$, a lower bound voltage $Th_V$, and an upper bound current $Th_i$ from the calculated charging resistance equivalents comprises:
    providing a number of charging current threshold values within a range of charging current threshold values;
    determining a ratio of a number of healthy batteries having charging resistance equivalents falling above each value within a number of values within the range of charging current threshold values to a number of healthy batteries charging resistance equivalents falling below each value within the number of values within the range of charging current values;

determining a standard deviation of a charging resistance equivalent $\rho_c$ amongst the batteries having a charging current less than each value within a number of values within the range of charging current threshold values;

selecting a threshold value $Th_{Ic}$ within the number of values within the range of charging current threshold values which is associated with both a high ratio and a small standard deviation; and using the selected threshold value as a cut-off value for disabling $\rho_c$ estimation when the battery current is lower than the selected threshold.

3. The method of claim 2 wherein a visual indication of reasonable charging current threshold choices is formed, comprising:

plotting the standard deviation over the range of charging current threshold values with a range of standard deviation values as a Y-axis; and plotting each determined ratio over the range of charging current threshold values with a ranged of ratio values as a Y-axis.

4. The method of claim 1 wherein using the controller to determine the value of the charging resistance equivalent $\rho_c$ comprises:

the controller using all of the identified current readings and associated terminal voltage readings>$Th_{Ic}$ to solve for $\rho_c$ according to:

$$p_c(i) = \frac{BatVc(i) - OCV}{BatIc(i)} \times \frac{Cn}{1 + \frac{Mc \times SOC}{Cc - SOC}}$$

$$\rho_c = \sum_{i=1}^{i=length(BatVc)} \frac{p_c(i)}{length\ (BatVc)}$$

Where $M_c$ is a charge transfer coefficient of the battery, $C_c$ is a normalized charging capacity of the battery, and $C_n$ is a nominal capacity of the battery.

5. The method of claim 1 wherein using the controller to determine the value of the charging resistance equivalent $\rho_c$ comprises:

the controller setting $\rho_c$ equal to a preset value $P_{default}$ if the mean value of BatV is less than $Th_V$ and 0 is less than the mean value of BatI when the mean value of BatI is less than $Th_I$, and SOC is equal to $Th_{SOC}$ or OCV is equal to $Th_{OCV}$.

6. The method of claim 1 wherein using the controller to determine the value of the charging resistance equivalent $\rho_c$ comprises:

the controller setting $\rho_c$ equal to a preset value $P_{default}$ if the mean value of BatV is not less than $Th_V$ or 0 is not less than the mean value of BatI, or the mean value of BatI is not less than $Th_I$, or SOC is not equal to $Th_{SOC}$ and OCV is not equal to $Th_{OCV}$, then $\rho_c$ equals a preset value $P_{NA}$.

* * * * *